(12) United States Patent
Rhoads

(10) Patent No.: US 7,248,246 B2
(45) Date of Patent: Jul. 24, 2007

(54) RACK MOUNT SERVER WITH TILTABLE DISPLAY

(75) Inventor: Monte J. Rhoads, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 244 days.

(21) Appl. No.: 09/872,139

(22) Filed: May 31, 2001

(65) Prior Publication Data

US 2002/0180692 A1    Dec. 5, 2002

(51) Int. Cl.
*G09G 5/00*    (2006.01)
(52) U.S. Cl. ...................... 345/156; 345/169
(58) Field of Classification Search ........ 345/156, 345/157, 108–111, 1.3, 2.1, 678, 619, 651, 345/2.2, 169; 361/678–686, 708, 826; 248/552, 248/183.3, 372.2; 353/57; 362/3; 360/137, 360/97.2
See application file for complete search history.

(56) References Cited

U.S. PATENT DOCUMENTS

| | | | | |
|---|---|---|---|---|
| 3,984,075 A | * | 10/1976 | Bahner et al. ............... | 248/552 |
| 4,570,892 A | * | 2/1986 | Czech et al. ............. | 248/372.1 |
| 4,827,439 A | * | 5/1989 | Licht ........................... | 361/681 |
| 4,827,646 A | * | 5/1989 | Miller et al. .................. | 40/591 |
| 4,834,329 A | * | 5/1989 | Delapp ..................... | 248/183.3 |
| 5,146,390 A | * | 9/1992 | Wong ........................ | 361/825 |
| 5,173,686 A | * | 12/1992 | Fujihara ...................... | 345/87 |
| 5,345,362 A | * | 9/1994 | Winkler ....................... | 361/681 |
| 5,388,032 A | * | 2/1995 | Gill et al. ...................... | 700/17 |
| 5,546,270 A | * | 8/1996 | Konno et al. ............... | 361/680 |
| 6,064,373 A | | 5/2000 | Ditzik | |
| 6,144,549 A | * | 11/2000 | Moss et al. .................. | 361/681 |
| 6,229,693 B1 | * | 5/2001 | Karidis et al. .............. | 361/681 |
| 6,365,820 B1 | * | 4/2002 | Kondo et al. .................. | 84/658 |
| 6,381,125 B1 | * | 4/2002 | Mizoguchi et al. ......... | 361/682 |
| 6,392,877 B1 | * | 5/2002 | Iredale ....................... | 361/683 |
| 6,407,983 B1 | * | 6/2002 | Zheng et al. ............... | 370/232 |
| 6,418,010 B1 | * | 7/2002 | Sawyer ....................... | 361/681 |
| 6,522,529 B1 | * | 2/2003 | Huilgol et al. .............. | 361/681 |
| 6,522,530 B2 | * | 2/2003 | Bang .......................... | 361/681 |
| 6,532,147 B1 | * | 3/2003 | Christ, Jr. ................... | 361/683 |
| 6,606,081 B1 | * | 8/2003 | Jaeger et al. ............... | 345/111 |
| 6,611,249 B1 | * | 8/2003 | Evanicky et al. ........... | 345/102 |
| 6,636,426 B2 | * | 10/2003 | Inman ........................ | 361/724 |
| 6,778,381 B1 | * | 8/2004 | Bolognia et al. ........... | 361/681 |
| 6,847,367 B1 | * | 1/2005 | von Alten et al. .......... | 345/530 |
| 2002/0027767 A1 | * | 3/2002 | Ryder ......................... | 361/683 |
| 2002/0034067 A1 | * | 3/2002 | Massaro ..................... | 361/728 |
| 2003/0135656 A1 | * | 7/2003 | Schneider et al. .......... | 709/250 |
| 2004/0100621 A1 | * | 5/2004 | Shiraishi et al. .............. | 353/57 |
| 2004/0165348 A1 | * | 8/2004 | Clark et al. ................. | 361/686 |
| 2005/0175218 A1 | * | 8/2005 | Vertegaal et al. ........... | 382/103 |
| 2005/0207100 A1 | * | 9/2005 | Heckerman ................. | 361/681 |
| 2005/0225959 A1 | * | 10/2005 | Pohlert et al. ................. | 362/3 |
| 2005/0243021 A1 | * | 11/2005 | Perez et al. ................. | 345/1.3 |
| 2006/0082518 A1 | * | 4/2006 | Ram ........................... | 345/1.1 |

\* cited by examiner

*Primary Examiner*—Bipin Shalwala
*Assistant Examiner*—Prabodh Dharia
(74) *Attorney, Agent, or Firm*—Blakely, Sokoloff, Taylor & Zafman LLP

(57) ABSTRACT

A rack mount server or device with an integrated display that has an adjustable viewing angle. An adjustable viewing angle allows rack mount servers and devices to be stacked and still maintain viewability of their display screens.

10 Claims, 8 Drawing Sheets

(prior art/side view)

(side view)

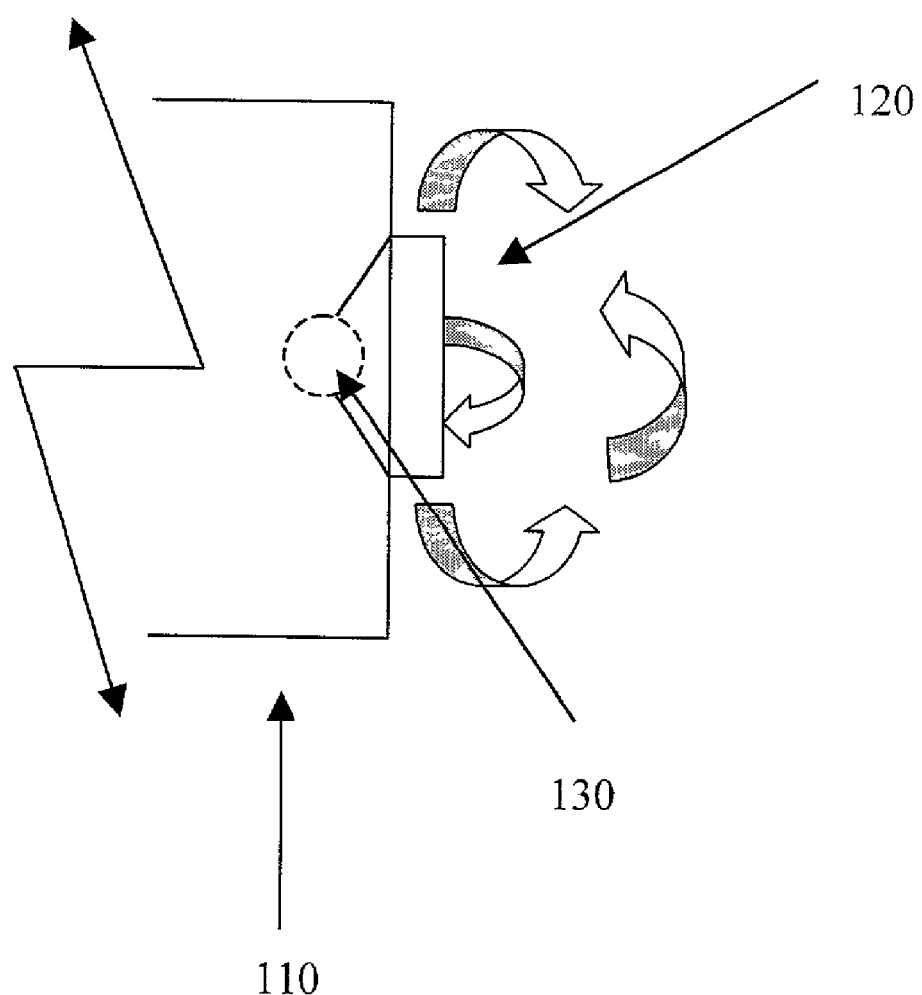

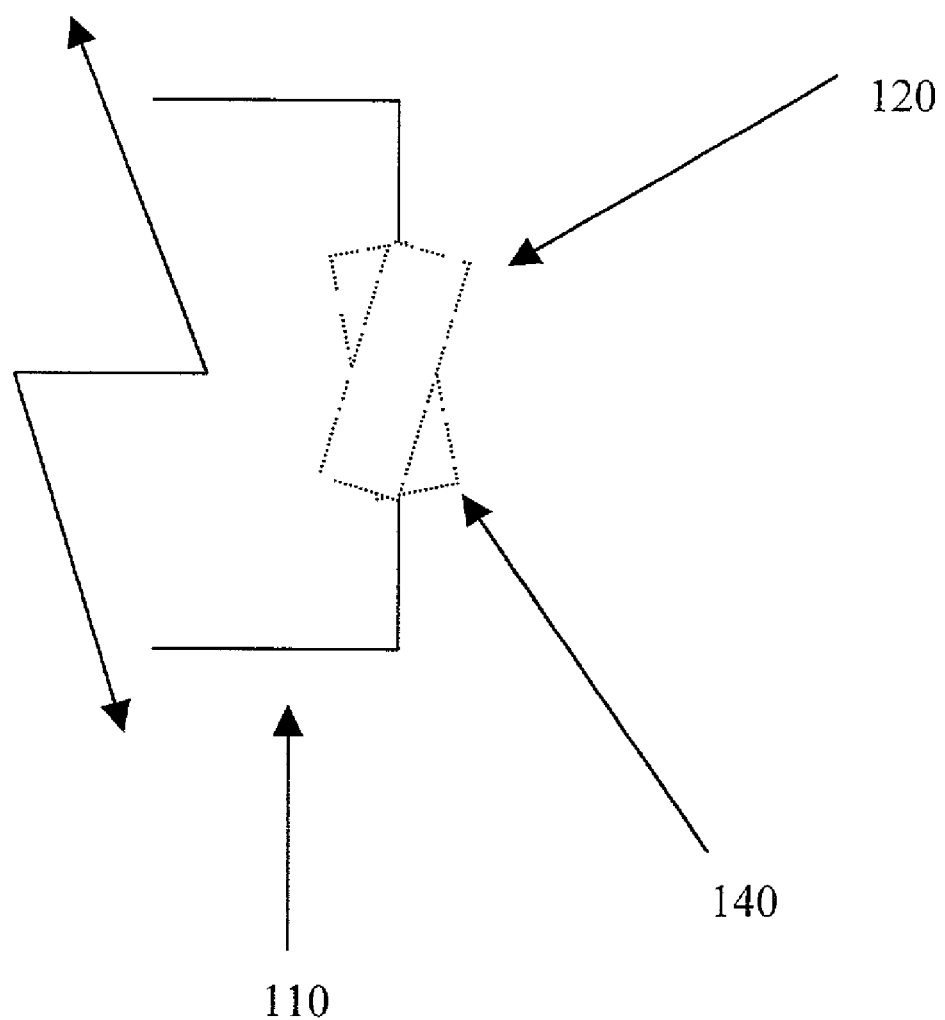

(top view)

(side view)

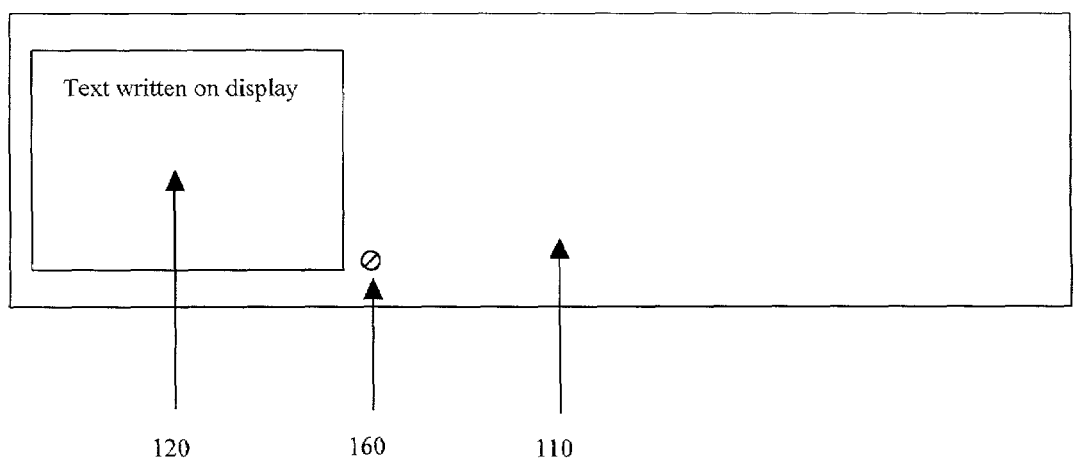

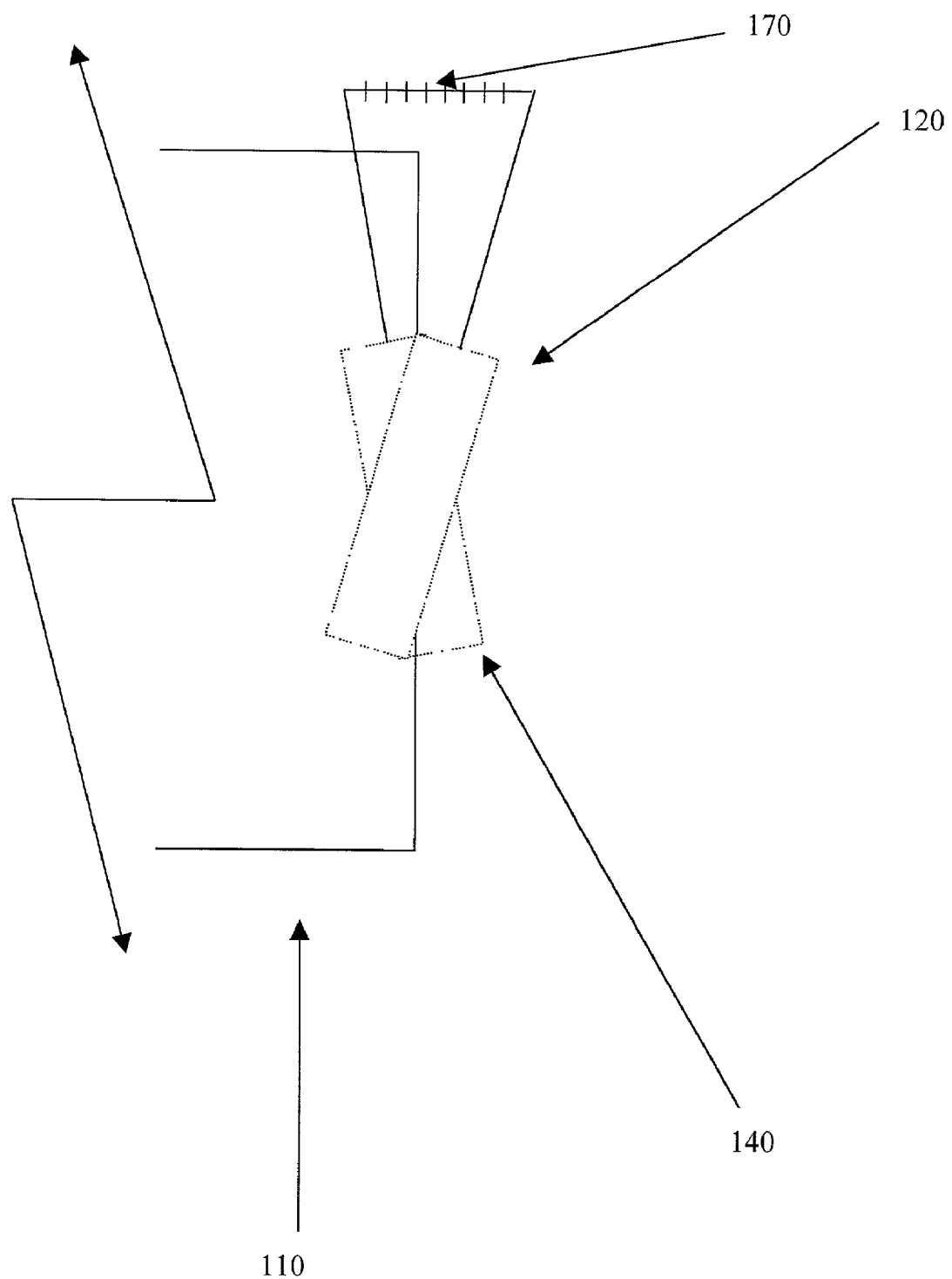

RACK MOUNT SERVER WITH TILTABLE DISPLAY

FIELD OF THE INVENTION

The present invention relates to adjustable displays for rack mount devices, such as 1U/2U rack mount servers, wherein the rack mount devices have a tiltably attached display to allow for better viewing angles.

BACKGROUND OF THE INVENTION

Rack mount devices, such as 1U/2U rack mount servers, are typically stacked on mounts to allow efficient use of space. Rack mounted devices are very common and are stacked vertically in mounts in a manner known to those skilled in the art. Referring to FIG. 1, a rack mount device 100, having a front portion 110, includes a display device on a user interface 120. The display device typically has a flat panel LCD mounted on the front of its enclosure with the viewing screen parallel to the plane of the front of the device. When many rack mount devices are mounted on some larger racks the ability to view the display screen is lessened for devices mounted on the top or bottom of these racks. For example, because the screen is mounted parallel to the front face of the rack mount device, it is best seen from an ideal viewing angle directly in front of the screen where the view is both perpendicular to and centered on the viewing screen. This creates the viewing problem in the prior art where the devices above or below eye level are difficult to read due to the viewing angle. Most rack mount devices with displays suffer from similar shortcomings.

One solution to the viewability problem is to have a display with an adjustable brightness. This allows the viewer to adjust the harder to view screens on a higher setting to allow more visibility for poor viewing angles. However, this solution suffers from significant disadvantages. First, typical displays are LCDs which have a maximum viewing angle. Adjusting the intensity of the display only works if the viewer is still within this viewing range. This can be a disadvantage, for example, when the devices mounted near the top or bottom of the rack are outside of the viewing range.

BRIEF DESCRIPTION OF THE DRAWINGS

The invention is illustrated by way of example, and not by way of limitation, in the figures of the accompanying drawings in which like reference numerals refer to similar elements.

FIG. 3 is a side view of one embodiment of a rack mount device having a display tiltably attached by a ball and socket joint allowing multiple degrees of freedom for adjustment.

FIG. 4 is a side view of one embodiment of a rack mount device with the display attached by a single hinge attachment allowing one axis for rotation.

FIG. 6 is a front view showing one embodiment of an adjustment mechanism to secure the screen from inadvertent adjustment.

FIG. 7 is a side view showing one embodiment of an indexed attachment allowing the screen to be adjusted to discrete positions.

DETAILED DESCRIPTION

Rack mount devices with adjustable displays are described. In the following description, for purposes of explanation, numerous specific details are set forth in order to provide a thorough understanding of the invention. It will be apparent, however, to one skilled in the art that the invention can be practiced without these specific details. In other instances structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The rack mount devices with tiltably adjustable displays described herein provide a wider optimum viewing angle for rack mount devices than those of the prior art. The devices described herein as rack mount devices or as rack mount servers can also be any of numerous other types of appliances, including but not limited to, such as a hub, a router, a switch, an amplifier, a piece of audio or video editing or recording or playback equipment. The display devices in rack mount devices are generally flat panel LCDs but may also be but not limited to any LCD, an LED, and a CRT, or any other display known to those skilled in the art.

The adjustable display device may be connected to the rack mount server or rack mount device by a movable coupling. The movable coupling can be any of numerous connections, for example, a single-hinge joint, a double-hinge joint, a multiple-hinge joint, a ball and-socket-joint, two sliding surfaces constrained to contact with each other, or any combination of these, or any other connection known to those skilled in the art. In another embodiment the movable coupling can be indexed to allow incremental adjustment through discrete steps.

Figure 1:
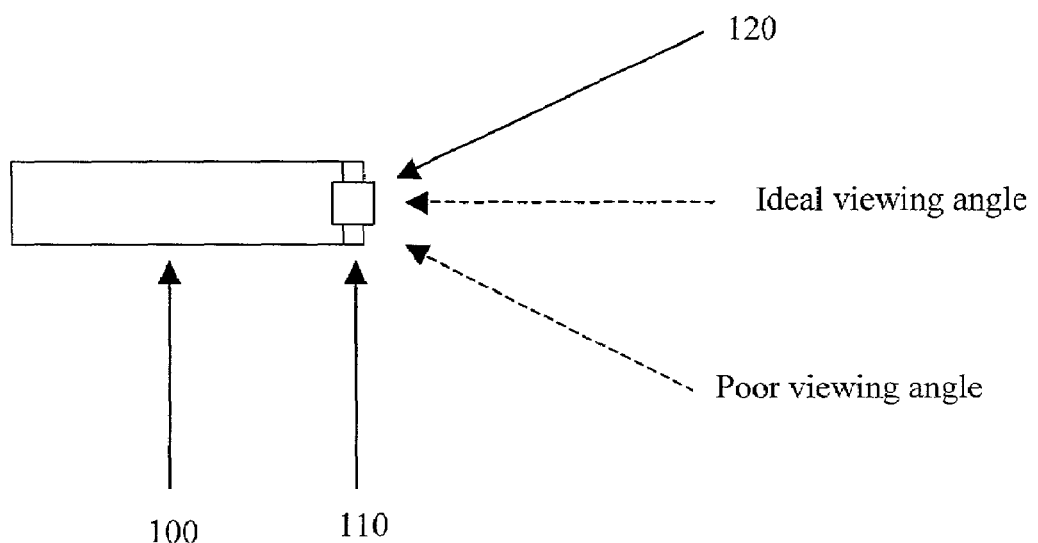
FIG. 1 is a side view of the prior art rack mount device with a LCD parallel to the plane of the front panel of the device.
Figure 2:
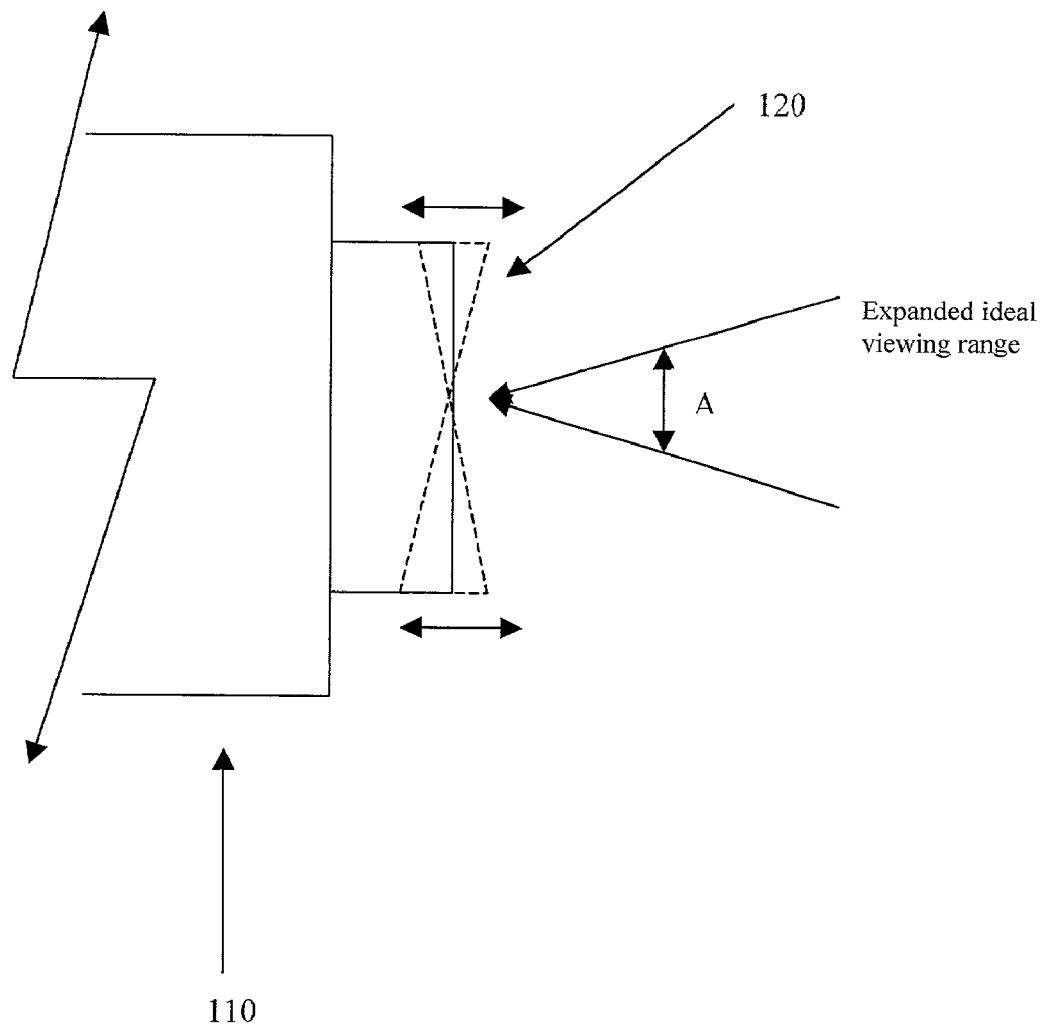
FIG. 2 is a side view of one embodiment of a rack mount device having a display with an adjustable viewing angle.

In one embodiment the display device 120 can be tiltably attached to the front 110 of the rack mount device 100. Referring to the drawings more particularly by reference numbers, FIG. 2 shows one embodiment. In this embodiment the tiltably attached display is coupled with the rack mount device by the movable coupling. This embodiment illustrates a range of motion A, which the display can adjust through that allows a wide range of optimum viewing.

Another embodiment, as shown in FIG. 3, provides that the movable coupling of the display device 120 may be a ball and socket joint 130. The ball and socket joint 130 may movably couple the display with the front 110 of the rack mount device or rack mount server 100 and allow multiple degrees of freedom of movement for the display.

In another embodiment, as shown in FIG. 4, provides that the movable coupling of the display device 120 may be a single hinge with one axis of rotation 140. The single hinge 140 may mount the display with the front 110 of the rack mount device or rack mount server 100 and allow the display to adjust about one axis. In the embodiment shown in FIG. 4 this axis is horizontal to allow for the viewing range to adjust vertically. Other embodiments allow the viewing range to be adjusted horizontally or along any angle ranging from the horizontal to the vertical.

Figure 5A:
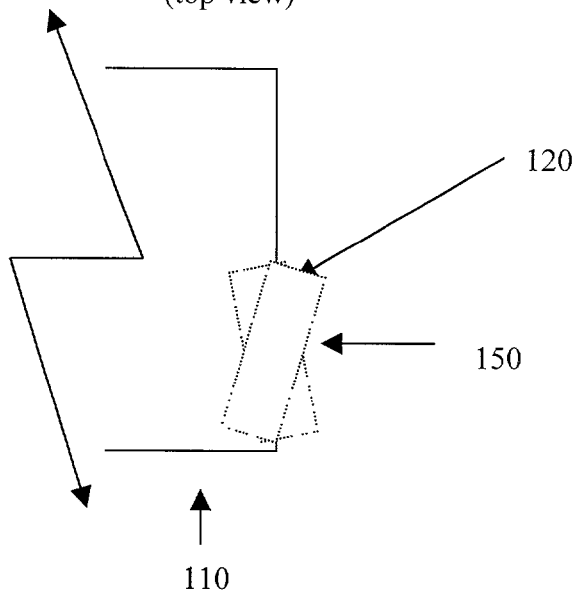
FIG. 5A is a top view of one embodiment of a rack mount device with a double hinge attachment allowing two axes of rotation for the display screen.
Figure 5B:
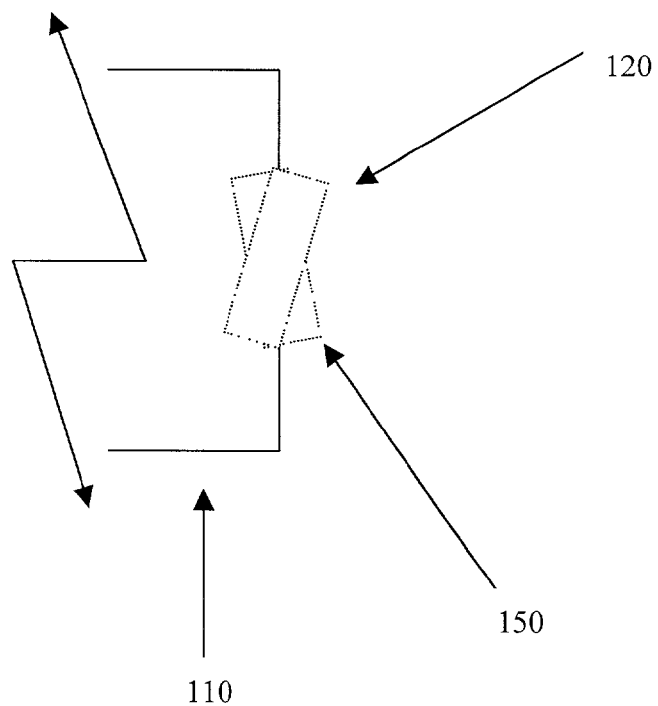
FIG. 5B is a side view of one embodiment of a rack mount device with a double hinge attachment allowing two axes of rotation for the display screen.

Another embodiment, as shown in FIG. 5, for example, provides that the movable coupling may be a double hinge 150 with two axis of rotation that are perpendicular and which allow two degrees of freedom of movement of the display device 120. The display device can be coupled with the rack mount server or rack mount device through the movable coupling. FIG. 5A and FIG. 5B are top and side views of the embodiment comprising two hinges for the movable coupling.

Referring to FIG. 6, one embodiment can include a securing mechanism 160 such as a tightening screw in order to secure the display device from adjustment. In this embodiment the screw is configured that when it is tightened it secures the display mechanism from movement.

Referring to FIG. 7, another embodiment can include an indexed movable coupling. The indexed movable coupling allows incremental adjustment through discrete positions 170. For example, the indexing may be a series of tabs that partially secures the display from movement. This embodiment would allow a plurality of semi-fixed positions that the dislpay can adjust to.

Figure 8:
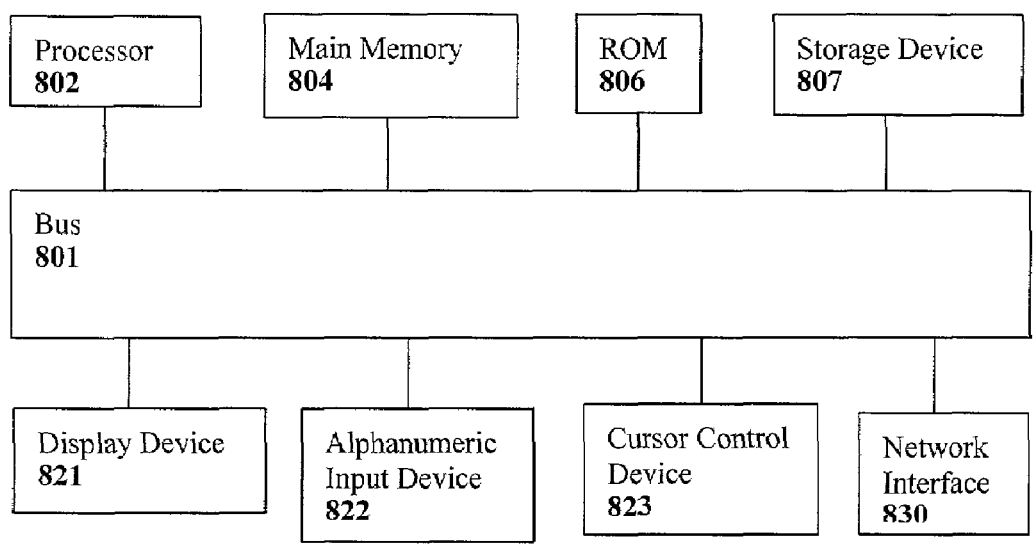
FIG. 8 illustrates one embodiment of a computer system.

Referring to FIG. 8, an embodiment may be a rack mount server, or other computing system, comprising the tiltably attached display. FIG. 8 is a block diagram of one embodiment of a computer system. The computer system illustrated in FIG. 8 is intended to represent a range of computer systems. Alternative computer systems can include more, fewer and/or different components.

Computer system 800 includes bus 801 or other communication device to communicate information, and processor 802 coupled to bus 801 to process information. While computer system 800 is illustrated with a single processor, computer system 800 can include multiple processors and/or co-processors. Computer system 800 further includes random access memory (RAM) or other dynamic storage device 804 (referred to as main memory), coupled to bus 801 to store information and instructions to be executed by processor 802. Main memory 804 also can be used to store temporary variables or other intermediate information during execution of instructions by processor 802.

Computer system 800 also includes read only memory (ROM) and/or other static storage device 806 coupled to bus 801 to store static information and instructions for processor 802. Data storage device 807 is coupled to bus 801 to store information and instructions. Data storage device 807 such as a magnetic disk or optical disc and corresponding drive can be coupled to computer system 800.

Computer system 800 can also be coupled via bus 801 to display device 821, such as a cathode ray tube (CRT) or liquid crystal display (LCD), to display information to a computer user. In one embodiment the display device is tiltably attached to allow a wider viewing angle. Alphanumeric input device 822, including alphanumeric and other keys, is typically coupled to bus 801 to communicate information and command selections to processor 802. Another type of user input device is cursor control 823, such as a mouse, a trackball, or cursor direction keys to communicate direction information and command selections to processor 802 and to control cursor movement on display 821. Computer system 800 further includes network interface 830 to provide access to a network, such as a local area network.

Instructions are provided to memory from a storage device, such as magnetic disk, a read-only memory (ROM) integrated circuit, CD-ROM, DVD, via a remote connection (e.g., over a network via network interface 830) that is either wired or wireless, etc. In alternative embodiments, hardwired circuitry can be used in place of or in combination with software instructions to implement the present invention. Thus, the present invention is not limited to any specific combination of hardware circuitry and software instructions.

A machine-accessible medium includes any mechanism that provides (i.e., stores and/or transmits) information in a form readable by a machine (e.g., a computer). For example, a machine-accessible medium includes read only memory (ROM); random access memory (RAM); magnetic disk storage media; optical storage media; flash memory devices; electrical, optical, acoustical or other form of propagated signals (e.g., carrier waves, infrared signals, digital signals); etc.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. An apparatus comprising:
   a rack-mount server enclosure having a front face;
   a display device mounted on the front face movably coupled to the enclosure for multiple degrees of freedom of movement for the display device; and
   an adjustable screw to lock the display device at one of a plurality of positions, wherein the plurality of positions includes a range of incremental positions between a position and a second position.

2. The apparatus of claim 1 wherein the display device comprises an LCD.

3. The apparatus of claim 1 wherein the movable coupling is a ball and socket joint.

4. A rack mount appliance, comprising: A front face;
   a display device, having a back end movably attached to an enclosure, to partially embed the back end of the display device within the rack mount appliance and enable multiple degrees of freedom of movement of the display device; and
   an adjustable screw to lock the display device at one of a plurality of positions, wherein the plurality of positions includes a range of incremental positions between a first position and a second position.

5. The rack mount appliance of claim 4, wherein the display device may be viewed at multiple angles with adjustment of the display device via the adjustable screw.

6. The rack mount appliance of claim 4 wherein the display device comprises an LCD.

7. The rack mount appliance of claim 4 wherein the movable coupling is a ball and socket joint.

8. A rack mount server having an integrated display device wherein an end of the display device is coupled to the rack mount server via a movable coupling, to provide multiple degrees of freedom of movement for the display device, and an adjustable screw to lock the display device at one of a plurality of positions, wherein the plurality of positions includes a range of incremental positions between a first position and a second position.

9. The rack mount server of claim 8 wherein the display device comprises an LCD.

10. The rack mount server of claim 8 wherein the movable coupling is a ball and socket joint.

* * * * *